United States Patent [19]
Ben-Guigui et al.

[11] Patent Number: 5,891,800
[45] Date of Patent: Apr. 6, 1999

[54] METHOD FOR DEPOSITING A FLOW FILL LAYER ON AN INTEGRATED CIRCUIT WAFER

[75] Inventors: Coren Ben-Guigui, Divon; Jeff Levy, Moshav Netofah; Zmira Lavie, Zichron Yaakov, all of Israel

[73] Assignee: Tower Semiconductor Ltd., Migdal Haemek, Israel

[21] Appl. No.: 864,365

[22] Filed: May 28, 1997

Related U.S. Application Data

[63] Continuation-in-part of Ser. No. 778,074, Jan. 7, 1997, abandoned, which is a continuation-in-part of Ser. No. 769,853, Dec. 19, 1996, Pat. No. 5,691,247.

[51] Int. Cl.$^6$ .................................................. H01L 21/316
[52] U.S. Cl. ........................ 438/631; 438/632; 438/760; 438/902; 438/787
[58] Field of Search .................................. 438/624, 787, 438/902, 631, 632, 760

[56] References Cited

U.S. PATENT DOCUMENTS

| | | |
|---|---|---|
| 5,003,062 | 3/1991 | Yen . |
| 5,079,188 | 1/1992 | Kawai . |
| 5,094,984 | 3/1992 | Liu et al. . |
| 5,192,715 | 3/1993 | Sliwa et al. . |
| 5,354,387 | 10/1994 | Lee et al. . |
| 5,364,818 | 11/1994 | Ouellet . |
| 5,395,785 | 3/1995 | Nguyen et al. . |
| 5,435,888 | 7/1995 | Kalnitsky et al. . |
| 5,503,882 | 4/1996 | Dawson . |
| 5,534,731 | 7/1996 | Cheung . |

OTHER PUBLICATIONS

Kiermasz, A. Et al, "Planarisation for Sub–Micron Devices Utilising a New Chemistry", *DUMIC Conference*, pp. 94–100, Feb. 1995.

Matsuura, M. Et al, "Novel Self–planarizing CVD Oxide for Interlayer Dielectric Applications",*IEEE IEDM*, 1994, pp. 117–120.

Dobson, C.D. et al, "Advanced $SiO_2$ Planarization Using Silane and $H_2O_2$", *Semiconductor Int'l.*, pp. 85–88, Dec. 94.

Roberts, B. et al, "Interconnect Metallization for Future Device Generations", *Solid State Tech.*, pp. 69–70 (1995).

Wolf, S., "Silicon Processing for the VLSI Era", vol. 2, pp.194–196 (1990.

El–Kareh, B., "Fundamentals of Semiconductor Processing Technology", *Kluwer Academic Pub.*, pp. 571–573 (1995).

Electotech Corp. Brochure, Thornbury Laboratories, Littleton–Upon–Severn, Bristol BS12 1NP, U.K. Tel: (0454) 419008.

Dobson et al, "Advanced $SiO_2$ Planarization Using Silane and $H_2O_2$" *Semiconductor Int'l.*, pp. 85–88, (Dec. 1994).

McClathe, et al, "Inorganic CVD Planarization", *European Semiconductor*, pp. 21–22, (Sep. 1995).

*Primary Examiner*—Charles Bowers
*Assistant Examiner*—Matthew Whipple
*Attorney, Agent, or Firm*—Mark M. Friedman

[57] ABSTRACT

An improved method for depositing a flow fill layer of an integrated circuit. Two flowlayers and two cap layers are deposited. The wafer is warmed between the deposition of the first cap layer and the deposition of the second flowlayer, to evaporate water from the first flowlayer. Preferably, each of the cap layers is deposited in two separate steps of plasma enhanced chemical vapor deposition, to inhibit crack formation in the flowlayers. Most preferably, after the depositions of each flowlayer, the flowlayer is planarized by flowing $H_2O_2$ thereupon.

24 Claims, 2 Drawing Sheets

5,891,800

METHOD FOR DEPOSITING A FLOW FILL LAYER ON AN INTEGRATED CIRCUIT WAFER

This is a continuation in part of U.S. patent application Ser. No. 08/778,074 filed Jan. 7, 1997, now abandoned which is a continuation in part of U.S. patent application Ser. No. 08/769,853 filed Dec. 19, 1996, now U.S. Pat. No. 5,691,247, issued Nov. 25, 1997.

FIELD AND BACKGROUND OF THE INVENTION

The present invention relates to the fabrication of ultra large scale integrated circuits and, more particularly, to an improved method for depositing a flow fill intermetallic dielectric on a wafer bearing these circuits.

The latest ultra large scale integrated circuits include features as small as about 0.5 microns and smaller. To effect contact with these features, the metallic contacts in the chip that contains the circuits must be stacked in three or more levels. These contacts are formed by a process that includes lithography and etch, and are separated by an intermetallic dielectric, typically $SiO_2$. For successful lithography and etch in the formation of a second or subsequent level of metal, the substrate above which they are deposited must be substantially flat.

A process for depositing an SiO2 intermetallic dielectric with a substantially flat upper surface is described in C. D. Dobson. A. Kiermasz, K. Beekman and R. J. Wilby, *Advanced $SiO_2$ planarization using silane and $H_2O_2$*, Semiconductor International, December 1994, pp. 85–88; in M. Matsuura, Y. Hayashide, H. Kotani, T. Nishimura, H. Iuchi, C. D. Dobson. A. Kiemasz, K. Beekmann and R. Wilby,; and in A. Kiermasz, C. D. Dobson, K. Beekmann add A. H. Bar-Ilan, *Planarization for sub-micron devices utilizing a new chemistry*, DUMIC Conference, Feb. 21–22, 1995, pp. 94–100. These references are incorporated by reference for all purposes as if fully set forth herein. FIG. 1 schematically shows the "flow fill layer" 30 thus deposited between and around metallic contacts 22. Flow fill layer 30 includes a base layer 32, a flowlayer 34, and a cap layer 36. The essence of the process is the deposition of flowlayer 34, by reacting $SiH_4$ and $H_2O_2$ at 0° C. to form a liquid layer, believed to be primarily $Si(OH)_4$ in composition. The liquid flows around and above metallic contacts 22, providing a dielectric layer with a substantially flat top surface. Base layer 32 of $SiO_2$ is deposited, prior to the deposition of flowlayer 34, by plasma enhanced chemical vapor deposition (PECVD), to provide a surface to which flowlayer 34 adheres well. Cap layer 36 of $SiO_2$ is deposited over flowlayer 34, also by PECVD, to protect flowlayer 34 in the final step: baking the wafer at a temperature of between 400° C. and 450° C. to transform flowlayer 34 from $Si(OH)_4$ to $SiO_2$.

It is important that flowlayer 34 not have cracks. The transformation of $Si(OH)_4$ to $SiO_2$ involves the evaporation of water as steam, which may induce the formation of cracks in flowlayer 34 as flowlayer 34 is transformed from a liquid to a solid. One of the purposes of cap layer 36 is to prevent the formation of these cracks. Cap layers 36 deposited by the processes known in the art have not been entirely successful in preventing crack formation. It also is important that the top surface of flow layer 30 be relatively flat. The processes known in the art have not entirely succeeded in achieving the desired degree of flatness.

There is thus a widely recognized need for, and it would be highly advantageous to have, a method of depositing a flow layer with a flatter top surface and less crack formation than in the prior art processes.

SUMMARY OF THE INVENTION

According to the present invention there is provided a process for depositing a flow fill layer on an integrated circuit wafer, including the steps of: (a) depositing a first flowlayer on the wafer; and (b) planarizing the first flowlayer.

According to the present invention, two flowlayers and two cap layers are deposited. The first cap layer is deposited above the first flowlayer; the second flowlayer is deposited above the first cap layer; and the second cap layer is deposited above the second flowlayer. Preferably, the wafer is warmed in-between the deposition of the first cap layer and the deposition of the second flowlayer, to evaporate water from the first flowlayer. It is preferable but not essential that both cap layers be deposited essentially as described in U.S. Pat. No. 5,691,247.

Most preferably, after each flowlayer is deposited and before the corresponding cap layer is deposited, $H_2O_2$ is flowed onto the flowlayer, in a planarization step. These planarization steps have been found to greatly improve the global planarization of the flow fill layer.

BRIEF DESCRIPTION OF THE DRAWINGS

The invention is herein described, by way of example only, with reference to the accompanying drawings, wherein.

DESCRIPTION OF THE PREFERRED EMBODIMENTS

The present invention is of a method for depositing a flow fill layer. Specifically, the present invention can be used to improve the flatness of the upper surface of the flow fill layer and to inhibit crack formation in the flow fill layer.

The principles of flow fill layer deposition according to the present invention may be better understood with reference to the drawings and the following description. The process parameters described herein are specific to the manufacture of a flow fill layer whose base layer 32 is 2000 Å thick, using a Planar 200 multi-chamber cluster tool manufactured by Electrotech of Bristol, UK; but it will be readily apparent to one ordinarily skilled in the art how to adjust the parameters for flow fill layers of other geometries and for other integrated circuit manufacturing devices.

The process parameters recommended by Electrotech are as follows:

Base Layer:

| | |
|---|---|
| pressure | 1400 mT |
| Nitrogen | 1500 sccm |
| Nitrous Oxide | 3500 sccm |
| $SiH_4$ | 150 sccm |

| | |
|---|---|
| RF power | 100 W |
| time | 38 seconds |
| Flowlayer: | |
| pressure | 850 mT |
| Nitrogen | 300 sccm |
| SiH$_4$ | 120 sccm |
| 60% H$_2$O$_2$ | 0.65 g/sec |
| time | 62 seconds |
| Cap Layer: Warm-up Step: | |
| final temperature | 300° C. |
| time | 90 seconds |
| Cap Layer: Deposition: | |
| pressure | 750 mT |
| Nitrogen | 1000 sccm |
| Nitrous Oxide | 2000 sccm |
| SiH$_4$ | 100 sccm |
| RF power | 500 W |
| time | 36 seconds |

In the Electrotech warm-up step, the wafer is maintained at a temperature of 300° C. for about 90 seconds in order to start the evaporation water from flowlayer 34 before the actual deposition of the cap layer.

Figure 1:
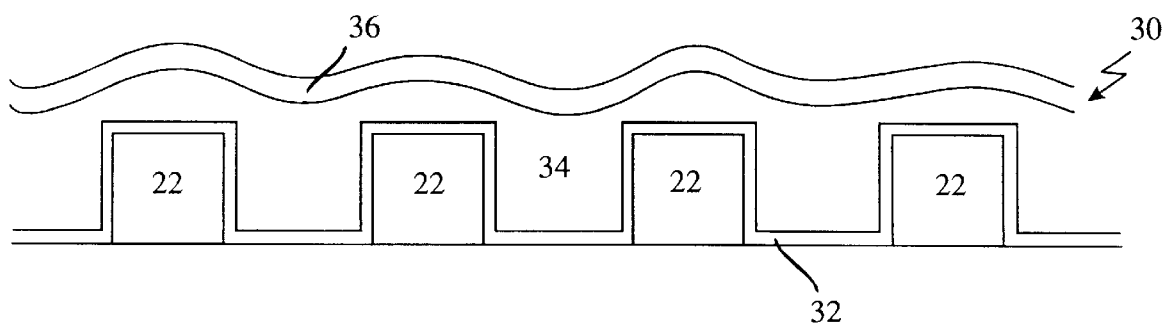
FIG. 1 (prior art) is a schematic cross-section through a prior art flow fill layer.
Figure 2:
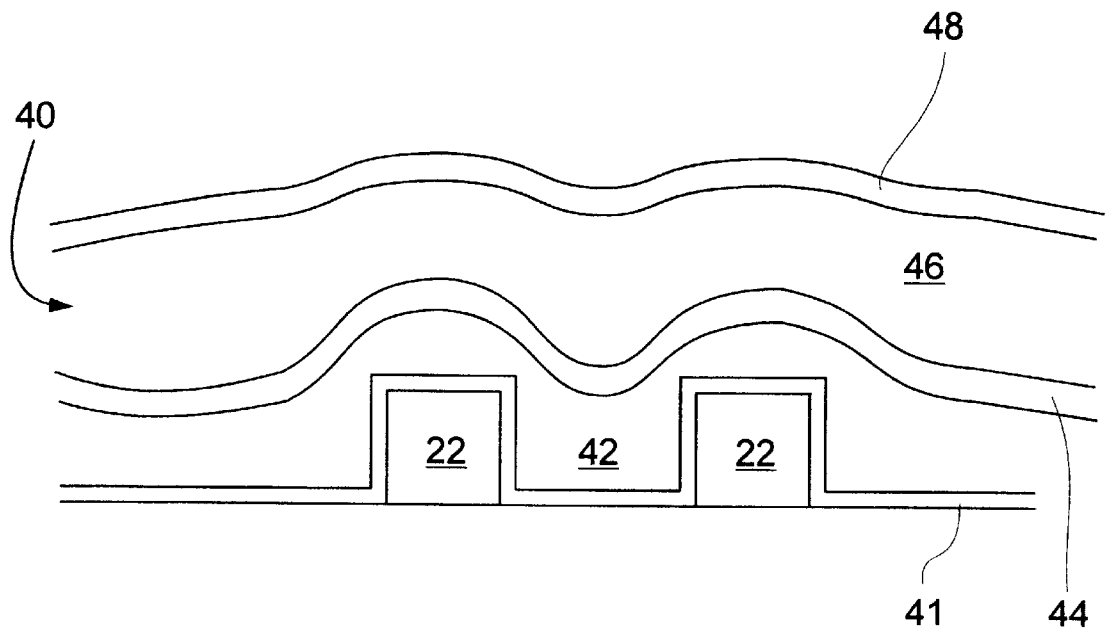
FIG. 2 is a schematic cross-section through a flow fill layer of the present invention, formed without planarization of the flowlayers.
Figure 3:
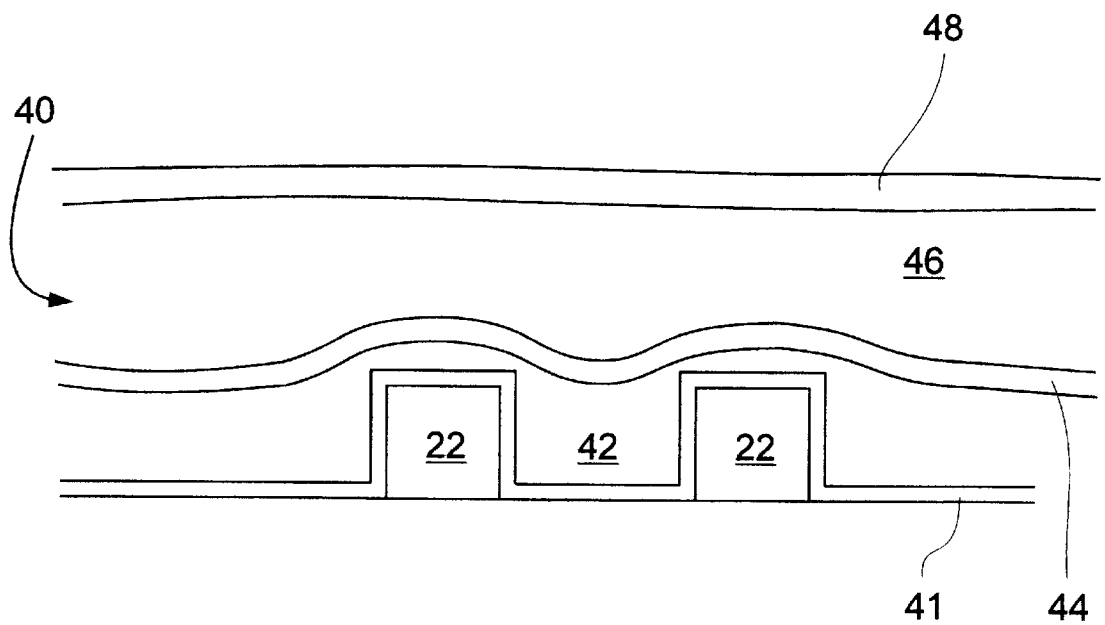
FIG. 3 is a schematic cross-section through a flow fill layer of the present invention, formed with planarization of the flowlayers.

FIG. 2 is a schematic cross section of a flow fill layer 40 deposited between and around metallic contacts 22 according to the present invention, without the additional and most preferred steps of planarization of the flowlayers. FIG. 3 is a schematic cross section of a flow fill layer 40 deposited between and around contacts 22 according to the present invention including planarization of the flowlayers. Flow fill layer 40 includes a base layer 41 identical to base layer 32 of FIG. 1, and also two flowlayers 42 and 46, and two cap layers 44 and 48. Preferably, first flowlayer 42 is deposited to a thickness of between about 1000 Å and about 5000 Å, most preferably about 4000 Å. Then, first cap layer 44 is deposited to a thickness of between about 1000 Å and about 2000 Å, most preferably about 1500 Å, in two PECVD steps. The first PECVD step deposits between about 500 Å and about 1000 Å of first cap layer 44, most preferably about 500 Å. The second PECVD step also deposits between about 500 Å about 1000 Å of first cap layer 44, most preferably about 1000 Å. Then, second flowlayer 46 is deposited to a thickness of between about 3000 Å and about 7000 Å, most preferably about 6000 Å. Finally, second cap layer 48 is deposited to a thickness of between about 2000 Å and about 3000 Å, preferably about 2500 Å, also in two PECVD steps. The first PECDV step deposits between about 500 Å and about 1000 Å of second cap layer 48, most preferably about 1000 Å. The second PECVD step deposits between about 1000 Å and about 1500 Å of second cap layer 48, most preferably about 1500 Å. In between the deposition of first cap layer 44 and second flowlayer 46, the wafer is warmed to evaporate water from first flowlayer 42.

| | |
|---|---|
| First Flowlayer: Deposition: | |
| pressure | 850 mT |
| Nitrogen | 300 sccm |
| SiH$_4$ | 120 sccm |
| 60% H$_2$O$_2$ | 0.65 g/sec |
| time | 28 seconds |
| First Flowlayer: Planarization: | |
| pressure | 850 mT |
| Nitrogen | 300 sccm |
| 60% H$_2$O$_2$ | 0.65 g/sec |
| time | 30–150 seconds |
| First Cap Layer: First Step: Warm-up: | |
| final temperature | 300° C.–350° C. |
| time | up to 10 seconds |
| First Cap Layer: First step: Deposition: | |
| pressure | 750 mT |
| Nitrogen | 1000 sccm |
| Nitrous Oxide | 2000 sccm |
| SiH$_4$ | 100 sccm |
| RF power | 500 W |
| time | 6 seconds |
| First Cap Layer: Second Step: Warm-up: | |
| final temperature | 300° C.–350° C. |
| time | 90–180 seconds |
| First Cap Layer: Second Step: Deposition: | |
| pressure | 750 mT |
| Nitrogen | 1000 sccm |
| Nitrous Oxide | 2000 sccm |
| SiH$_4$ | 100 sccm |
| RF power | 500 W |
| time | 18 seconds |
| Intermediate Warm-up: | |
| final temperature | 300° C.–350° C. |
| time | up to 180 seconds |
| Second Flowlayer: Deposition: | |
| pressure | 850 mT |
| Nitrogen | 300 sccm |
| SiH$_4$ | 120 sccm |
| 60% H$_2$O$_2$ | 0.65 g/sec |
| time | 40 seconds |
| Second Flowlayer: Planarization: | |
| pressure | 850 mT |
| Nitrogen | 300 sccm |
| 60% H$_2$O$_2$ | 0.65 g/sec |
| time | 30–150 seconds |
| Second Cap Layer: First Step: Warm-up: | |
| final temperature | 300° C.–350° C. |
| time | up to 10 seconds |
| Second Cap Layer: First step: Deposition: | |
| pressure | 750 mT |
| Nitrogen | 1000 sccm |
| Nitrous Oxide | 2000 sccm |
| SiH$_4$ | 100 sccm |
| RF power | 500 W |
| time | 12 seconds |
| Second Cap Layer: Second Step: Warm-up: | |
| final temperature | 300° C.–350° C. |
| time | 90–180 seconds |
| Second Cap Layer: Second Step: Deposition: | |
| pressure | 750 mT |
| Nitrogen | 1000 sccm |
| Nitrous Oxide | 2000 sccm |
| SiH$_4$ | 100 sccm |
| RF power | 500 W |
| time | 12 seconds |

It is to be understood that these parameters are illustrative only. The essence of the present invention is the deposition of two flow layers 42 and 46, the planarization of the two flow layers using H$_2$O$_2$, and the deposition of two cap layers 44 and 48, with partial evaporation of water from first flowlayer 42 after the deposition and planarization of first cap layer 44 and before the deposition of second flow layer 46. It will be apparent, to one ordinarily skilled in the art, how to adapt these parameter values for other applications.

While the invention has been described with respect to a limited number of embodiments, it will be appreciated that many variations, modifications and other applications of the invention may be made.

What is claimed is:

1. A process for depositing a flow fill layer on an integrated circuit wafer, comprising the steps of:
   (a) depositing a first flowlayer on the wafer; and
   (b) planarizing said first flowlayer by flowing a gas consisting essentially of $H_2O_2$ onto said first flowlayer.

2. The process of claim 1, wherein said $H_2O_2$ is flowed onto said flowlayer for between about 30 seconds and about 150 seconds.

3. The process of claim 1, further comprising the steps of:
   (c) depositing a first cap layer above said first flowlayer;
   (d) depositing a second flowlayer above said first cap layer; and
   (e) planarizing said second flowlayer.

4. The process of claim 3, wherein said planarizing is effected by flowing $H_2O_2$ said second flowlayer.

5. The process of claim 4, wherein said $H_2O_2$ is flowed onto said second flowlayer for between about 30 seconds and about 150 seconds.

6. The process of claim 3, further comprising the step of:
   (f) depositing a second cap layer above said second flowlayer.

7. The process of claim 6, wherein said depositing of said second cap layer includes the steps of:
   (i) depositing a first thickness of said second cap layer;
   (ii) depositing a second thickness of said second cap layer; and
   (iii) warming the wafer, subsequent to said depositing of said first thickness of said second cap layer and prior to said depositing of said second thickness of said second cap layer.

8. The process of claim 3, wherein said depositing of said first cap layer includes the steps of:
   (i) depositing a first thickness of said first cap layer;
   (ii) depositing a second thickness of said first cap layer; and
   (iii) warming the wafer, subsequent to said depositing of said first thickness of said first cap layer and prior to said depositing of said second thickness of said first cap layer.

9. The process of claim 8, further comprising the step of:
   (f) warming the wafer, subsequent to said depositing of said first cap layer and prior to said depositing of said second flowlayer.

10. The process of claim 9, wherein said warming of said wafer, subsequent to said depositing of said first cap layer and prior to said depositing of said second flowlayer, is effected by maintaining said wafer at a temperature between about 300° C. and about 350° C. for up to about 180 seconds.

11. The process of claim 9, further comprising the step of:
    (g) depositing a second cap layer above said second flowlayer.

12. The process of claim 11, wherein said depositing of said second cap layer includes the steps of:
    (i) depositing a thickness of said second cap layer;
    (ii) depositing a second thickness of said second cap layer; and
    (iii) warming the wafer, subsequent to said depositing of said first thickness of said second cap layer and prior to said depositing of said second thickness of said second cap layer.

13. The process of claim 12, wherein said first flowlayer has a thickness, said first cap layer has a thickness, said second flowlayer has a thickness, and said second cap layer has a thickness; said thickness of said first flowlayer being about 2/7 of a sum of said thicknesses of said first flowlayer, said first cap layer, said second flow layer and said second cap layer; said thickness of said first cap layer being about 3/28 of said sum; said thickness of said second flowlayer being about 3/7 of said sum; and said thickness of said second cap layer being about 5/28 of said sum.

14. The process of claim 12, wherein said first flowlayer has a thickness of between about 1000 Å and about 5000 Å, said first cap layer has a thickness of between about 1000 Å and about 2000 Å, said second flowlayer has a thickness of between about 3000 Å and about 7000 Å, and said second cap layer has a thickness of between about 2000 Å and about 3000 Å.

15. The process of claim 14, wherein said first flowlayer has a thickness of about 4000 Å, said first cap layer has a thickness of about 1500 Å, said second flowlayer has a thickness of about 6000 Å, and said second cap layer has a thickness of about 2500 Å.

16. The process of claim 12, wherein said step of warning the wafer, subsequent to said depositing of said first thickness of said first cap layer and prior to said depositing of said second thickness of said first cap layer, and said step of warming the wafer, subsequent to said depositing of said first thickness of said second cap layer and prior to said depositing of said second thickness of said second cap layer, are effected by maintaining the wafer at a temperature of between about 300° C. and about 350° C. for between about 90 seconds and about 180 seconds.

17. The process of claim 12, wherein said first cap layer is deposited to a total thickness, said first thickness of said first cap layer being about ⅓ of said total thickness of said first cap layer; and wherein said second cap layer is deposited to a total thickness, said first thickness of said second cap layer being about ⅖ of said total thickness of said second cap layer.

18. The process of claim 12, wherein said first cap layer is deposited to a total thickness of about 1500 Å, said first thickness of said first cap layer being about 500 Å; and wherein said second cap layer is deposited to a total thickness of about 2500 Å, said first thickness of said second cap layer being about 1000 Å.

19. The process of claim 12, wherein said wafer is maintained at a temperature of between about 300° C. and about 350° C. for up to about 10 seconds subsequent to said depositing of said first flowlayer and prior to said depositing of said first cap layer; and wherein said wafer is maintained at a temperature of between about 300° C. and about 350° C. for up to about 10 seconds subsequent to said depositing of said second flowlayer and prior to said depositing of said second cap layer.

20. The process of claim 3, further comprising the step of:
    (f) warming the wafer, subsequent to said depositing of said first cap layer and prior to said depositing of said second flowlayer.

21. The process of claim 20, wherein said warming of said wafer, subsequent to said depositing of said first cap layer and prior to said depositing of said second flowlayer, is effected by maintaining said wafer at a temperature between about 300° C. and about 350° C. for about 180 seconds.

22. The process of claim 20, further comprising the step of:
    (g) depositing a second cap layer above said second flowlayer.

23. The process of claim 22, wherein said depositing of said second cap layer includes the steps of:

(i) depositing a first thickness of said second cap layer;

(ii) depositing a second thickness of said second cap layer; and (iii) warming the wafer, subsequent to said depositing of said first thickness of said second cap layer and prior to said depositing of said second thickness of said second cap layer.

24. A process for depositing a flow fill layer on an integrated circuit wafer, comprising the steps of:

(a) depositing a flowlayer on the wafer; and (b) subsequently planarizing said flowlayer, wherein said planarizing is effected by flowing $H_2O_2$ gas onto said flowlayer.

* * * * *